United States Patent
Laureanti

(10) Patent No.: US 6,455,925 B1
(45) Date of Patent: Sep. 24, 2002

(54) POWER TRANSISTOR PACKAGE WITH INTEGRATED FLANGE FOR SURFACE MOUNT HEAT REMOVAL

(75) Inventor: Steven J. Laureanti, Lewisville, TX (US)

(73) Assignee: Ericsson Inc., Plano, TX (US)

( * ) Notice: Subject to any disclaimer, the term of this patent is extended or adjusted under 35 U.S.C. 154(b) by 0 days.

(21) Appl. No.: 09/819,262

(22) Filed: Mar. 27, 2001

(51) Int. Cl.[7] ........................ H01L 23/02; H01L 23/053
(52) U.S. Cl. ...................... 257/678; 257/701; 257/704; 257/705; 257/708
(58) Field of Search ............................. 257/678, 700, 257/701, 704–706; 438/106, 121, 125, 122

(56) References Cited

U.S. PATENT DOCUMENTS

| | | | | |
|---|---|---|---|---|
| 3,958,195 A | * | 5/1976 | Johnson | 333/84 |
| 4,150,393 A | * | 4/1979 | Wilson et al. | 257/706 |
| 5,398,160 A | * | 3/1995 | Umeda | 361/701 |
| 5,861,670 A | * | 1/1999 | Akasaki | 257/701 |
| 5,933,327 A | * | 8/1999 | Leighton et al. | 361/719 |

FOREIGN PATENT DOCUMENTS

JP          59-135752    *   8/1984   .................. 257/705

* cited by examiner

Primary Examiner—Jasmine J B Clark
(74) Attorney, Agent, or Firm—Lyon & Lyon LLP

(57) ABSTRACT

A transistor package comprises a first layer in which a thermally conductive flange is integrated into a dielectric substrate layer, a transistor attached to the flange, and input and output contacts coupled to the transistor. The transistor package is attached to a circuit board such that its input and output contacts are electrically coupled to associated conductors on the circuit board. In one embodiment, the transistor package further comprises additional dielectric layers, bonded to the bottom layer, in which a top layer forms a lid covering the transistor. The layers intermediate the bottom and top layers have central areas cut away where the layers overlap the transistor, thereby forming an interior chamber in the package. Impedance matching networks may also be provided to couple the transistor input and output terminals to their respective contacts, where the matching networks tune the input and output impedances of the package. These matching networks may comprise a plurality of components and conductors implemented the intermediate layers and/or the top layer.

18 Claims, 2 Drawing Sheets

POWER TRANSISTOR PACKAGE WITH INTEGRATED FLANGE FOR SURFACE MOUNT HEAT REMOVAL

FIELD OF INVENTION

The invention relates to power transistor devices and methods of attaching power transistor devices to circuit boards.

BACKGROUND

A typical RF power transistor device includes one or more transistor dies attached to a metallic mounting flange. In addition to serving as a support structure, the mounting flange serves as a combined reference ground and heat sink. In particular, the flange acts as an immediate heat sink for the transistor die(s), which can generate significant amounts of heat. When installed, the mounting flange is attached to a metallic heat sink that is part of a circuit board assembly. Many different attachment techniques are known, e.g., solder bond, mechanical means such as screws or a retaining spring, or a thermally conductive adhesive. The mounting flange must provide adequate thermal transfer of heat from the die(s) to the larger heat sink, so it is important that the flange attachment process provide a solid thermal coupling.

When the mounting flange is attached by screws, one or more screw holes must be provided in both the mounting flange and the larger heat sink, requiring separate assembly steps by the manufacturer of the circuit boards using such RF power transistors. Further, the transistor devices have input and output lead frames attached to the sides of the mounting flanges, which typically require a hand soldering step separate from the normal reflow process. These extra steps in the manufacturing process increase manufacturing costs and potentially reduce manufacturing yield.

The current design of RF power transistor devices, as described above, is contrary to the direction in which the industry is moving. With manufacturing costs and reliability in mind, leaded and manually assembled components are being redesigned and made into surface mounted components. Despite these efforts, there has not been a significant breakthrough in producing a power transistor device package that meets the surface mount manufacturing needs of emerging technologies.

SUMMARY OF THE INVENTION

In accordance with one aspect, the invention provides for the implementation of power transistor packages as surface mounted circuit components, while still providing the ability to dissipate the significant heat generated by such transistors in high power, high frequency applications.

In one embodiment, a power transistor device package comprises a bottom substrate layer formed by pressure fitting a conductive flange integrated into a dielectric substrate material. A die having one or more transistors formed thereon is attached to the flange. Respective RF signal input and output contacts are located on the bottom substrate layer and electrically coupled to respective input and output terminals on the transistor die.

In one embodiment, the transistor package comprises additional dielectric layers, bonded to the bottom layer, in which the top layer forms a protective lid covering the transistor. Intermediate layers are cut-away where these layers overlap the transistor, thereby forming a cavity inside the package. Impedance matching networks may also be provided to couple the transistor input and output terminals to their respective contacts, the matching networks providing for input and output impedance tuning. These matching networks may comprise a plurality of components and conductors implemented the intermediate layers and/or the top layer.

Other aspects and features of the present invention will become apparent from consideration of the following description taken in conjunction with the accompanying drawings.

BRIEF DESCRIPTION OF THE DRAWINGS

Preferred embodiments are illustrated by way of example, and not by way of limitation, in the figures of the accompanying drawings, in which like reference numerals refer to like components, and in which.

DETAILED DESCRIPTION OF THE PREFERRED EMBODIMENTS

Figure 1:
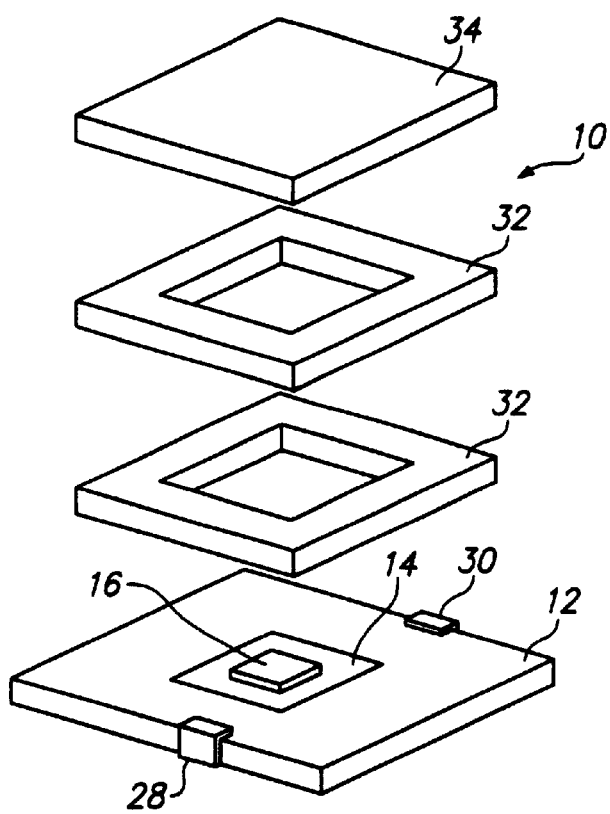
FIG. 1 is an exploded perspective view of substrate layers of a power transistor package prior to its complete assembly, generally illustrating concepts of the invention.
Figure 2:
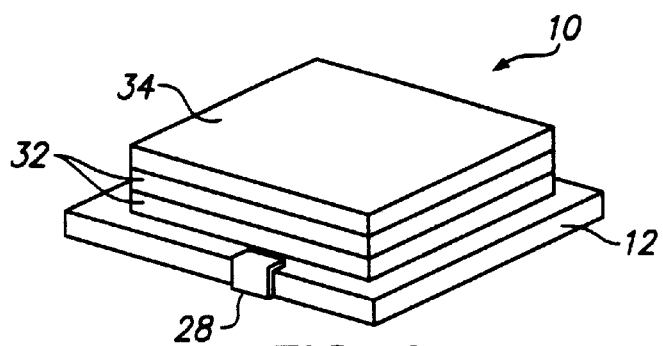
FIG. 2 is a perspective view of the transistor package of FIG. 1, fully assembled.

In accordance with a first aspect of the invention, a power transistor package 10 is assembled as shown in FIGS. 1 and 2. A bottom layer 12 is provided, where the bottom layer 12 is preferably composed of a dielectric substrate. A thermally conductive flange 14 is integrated into the bottom layer 12. The flange 14 is integrated into the substrate by a known process, such as being pressure fitted using the same process commonly used in conjunction with multilayer circuit board assemblies. The flange 14 is purposed to dissipate heat generated by the package 10, therefore it should be designed with appropriate dimensions for that purpose. For example, a flange that is too thin will not adequately dissipate the heat from areas of high heat concentration. Alternatively, the flange 14 could be formed by copper plating a substrate and adding vias, a structure which could also provide heat dissipation for the package 10.

A transistor die 16 is attached to the flange 14 with a known die-attach technique. The transistor 16 is preferably of the LDMOS or bipolar junction type, or it may be any other type of transistor suitable for the intended application of the package 10. The transistor 16 has an input terminal 18, an output terminal 20, and a common terminal 22. The common terminal 22 is coupled to the flange 14, which in addition to being thermally conductive is also electrically conductive.

A typical application of a transistor package is a power amplifier. In a typical power amplifier application, the flange 14 would be electrically grounded, as shown in the schematic diagram of FIG. 3. The input 23 of the amplifier would be coupled across the input 18 and common 22 terminals by a first impedance matching network 24. Likewise, the output 25 of the amplifier would be coupled across the output 20 and common 22 terminals by a second impedance matching network 26. The use and desirability of impedance matching networks in such an application is widely known, and is explained in, e.g., U.S. Pat. No. 5,969,582 to Boesch et al., which is hereby incorporated fully by reference.

The package includes input and output contacts 28 and 30, respectively, which are preferably disposed on the bottom layer 12 of the package 10. These contacts 28, 30 are conductive and coupled to the input and output terminals 18, 20 of the transistor 16, preferably by impedance matching networks 24, 26 as described above. The contacts 28, 30 provide an electrical interface between the transistor 16 and a circuit board 52, to which the transistor package 10 is adapted to be attached. Preferably, contacts 28, 30 comprise conductive wrap around pads on edges of the bottom layer 12. The contacts 28, 30 could also be formed by conductive traces and vias.

In the illustrated preferred embodiments, one or more intermediate substrate layers 32 and a top layer 34 are also provided. The intermediate layers 32 have central portions removed, thus forming a cavity inside the package 10 when the layers are assembled. The top layer 34 functions, in part, as a protective cover for the transistor 16 and any circuitry inside. When assembled (as shown in FIG. 2), the transistor package 10 is adapted to be attached to a circuit board like any other surface mounted device.

Figure 3:
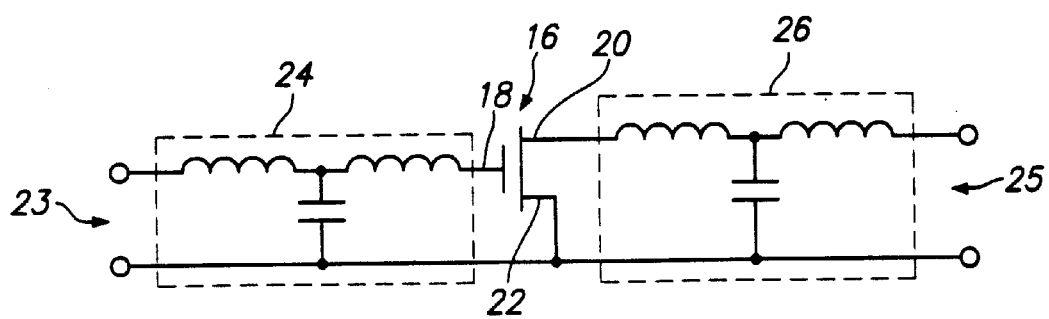
FIG. 3 is a simplified schematic circuit diagram of the power transistor package of FIG. 2.
Figure 4:
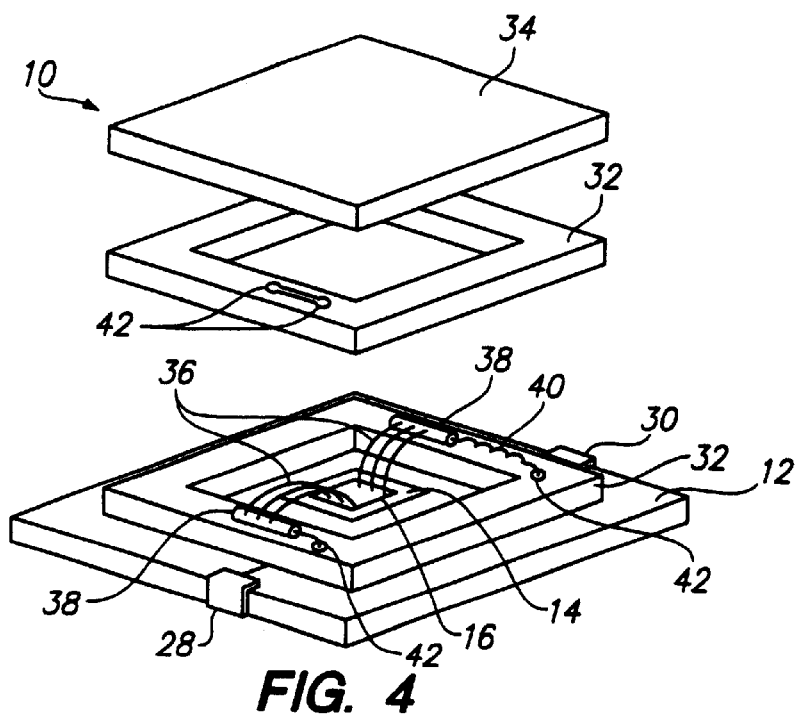
FIG. 4 is a partially assembled, exploded perspective view the transistor package, illustrating the electrical components and connections.
Figure 5:
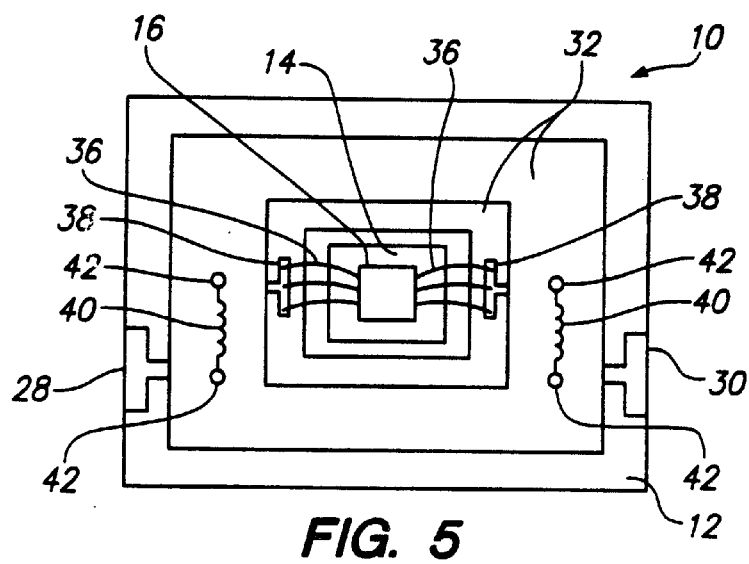
FIG. 5 is a plan view of the transistor package with the top layer removed.

As shown in FIGS. 3, 4 and 5, the input and output terminals 18, 20 of the transistor 16 are coupled to their associated input and output contacts 28, 30, preferably by impedance matching networks 24, 26. One or more bond wires 36 are used to connect each of the input and output terminals 18, 20 to respective conductors 38 on one of the surrounding substrates, i.e., any of the layers 12, 32, 34, but preferably one of the intermediate layers 32. If impedance matching is employed, a network of conductors 38 and components, e.g., inductors 40, form impedance matching networks 24 and 26, shown in the circuit schematic of FIG. 3. The impedance matching networks 24, 26 may be implemented on the several substrates that form the package 10, including the bottom layer 12, the intermediate layers 32, and the top layer 34. The networks 24, 26 are thus formed like any standard multilayer circuit board, using, e.g., conductive vias 42 to "jump" from one layer to the next.

Figure 6:
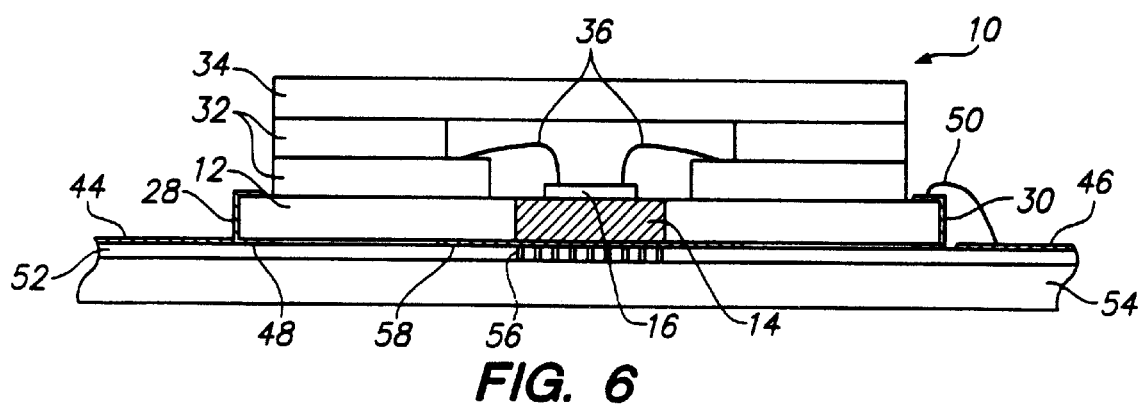
FIG. 6 is a cross sectional view of the transistor package mounted on a circuit board.

Referring to FIG. 6, the transistor package 10 can be attached to a laminate printed circuit board 52 such that the package input and output contacts 28, 30 are lined up with associated foil conductors 44, 46 on the top surface of circuit board 52. By way of non-limiting examples, a solder paste or thermal grease 58 may be used to electrically and physically connect the bottom layer 12 of the transistor package 10 to the circuit board 52. Metal plated via holes 56 are provided through the circuit board 52 directly underlying the flange 14 to provide an electrical path for the common element current from the transistor die 16 to a metallic heat sink/reference ground 54 underlying the circuit board 52.

In order to illustrate a couple of possible methods for connecting the package contacts 28 and 30 to the circuit board contacts 44 and 46, the package input contact 28 is electrically connected to the circuit board input contact 44 by a physical solder bond 48. Package output contact 30 is electrically connected to the circuit board output contact 46 by one or more bond wires 50. Conductive clips, fasteners, and other techniques for mounting surface mounted devices can also be used.

It can be appreciated that transistor packages according to the disclosed embodiments offer several advantages when used in a manufacturing process. For example, the manufacturer of circuit boards that uses such a transistor package can buy the transistors in tape and reel, which is common for similar surface mounted devices. In tape and reel form, the transistors can be assembled onto circuit boards as part of a manufacturer's normal reflow process, thus eliminating extra steps that existing power transistor packages require, such as fastening the flange to a heat sink and separate hand soldering.

While preferred embodiments and applications have been shown and described, as can be appreciated by those of ordinary skill in the art, the invention can be embodied in other specific forms without departing from the inventive concepts contained herein. The presently disclosed embodiments, therefore, should be considered as illustrative, not restrictive. Accordingly, the invention should not be limited except by the scope of the appended claims and their equivalents.

What is claimed is:

1. A power transistor package, comprising:
   a bottom substrate layer comprising a conductive flange portion integrated with a dielectric portion;
   a transistor attached to the conductive flange portion of the bottom substrate layer, the transistor having an input terminal and an output terminal; and
   an input contact and an output contact, the input and output contacts electrically coupled to the respective transistor input and output terminals,
   wherein the conductive flange portion of the bottom substrate layer is electrically coupled to a common terminal of the transistor.

2. The power transistor package of claim 1, wherein the bottom substrate layer is formed by pressure fitting the conductive flange portion into the dielectric portion.

3. The power transistor package of claim 1, further comprising:
   one or more intermediate substrate layers bonded to the bottom substrate layer, the one or more intermediate substrate layers each having a cut away center region overlying the transistor location on the bottom substrate layer; and
   a top substrate layer bonded to the one or more intermediate substrate layers opposite the bottom substrate layer, thereby enclosing the transistor within the package.

4. The power transistor package of claim 1, further comprising an input impedance matching network electrically coupling the transistor input terminal to the input contact.

5. The power transistor package of claim 1, further comprising an output impedance matching network electrically coupling the transistor output terminal to the output contact.

6. The power transistor package of claim 1, wherein the input and output contacts comprise respective conductors disposed on the bottom substrate layer.

7. The power transistor package of claim 4, wherein the input matching network comprises at least one component disposed on the top substrate layer or on one of the one or more intermediate substrate layers.

8. The power transistor package of claim 5, wherein the output matching network comprises at least one component disposed on the top substrate layer or on one of the one or more intermediate substrate layers.

9. A power transistor package, comprising:
   a bottom substrate layer comprising a conductive flange portion integrated with a dielectric portion;

a transistor attached to the conductive flange portion of
the bottom substrate layer, the transistor having an
input terminal and an output terminal;

a top substrate layer directly or indirectly bonded to the
bottom substrate layer, thereby enclosing the transistor
within the package; and an input contact and an output contact, the input and
output contacts electrically coupled to the respective
transistor input and output terminals.

wherein the conductive flange portion of the bottom
substrate layer is electrically coupled to a common
terminal of the transistor.

10. The power transistor package of claim 9, wherein the bottom substrate layer is formed by pressure fitting the conductive flange portion into the dielectric portion.

11. The power transistor package of claim 9, further comprising:

one or more intermediate substrate layers interposed between the bottom and top substrate layers, the one or more intermediate substrate layers each having a cut away center region overlying the transistor location on the bottom substrate layer.

12. The power transistor package of claim 9, further comprising an input impedance matching network electrically coupling the transistor input terminal to the input contact.

13. The power transistor package of claim 9, further comprising an output impedance matching network electrically coupling the transistor output terminal to the output contact.

14. The power transistor package of claim 9, wherein the input and output contacts comprise respective conductors disposed on the bottom substrate layer.

15. The power transistor package of claim 12, wherein the input matching network comprises at least one component disposed on the top substrate layer or on one of the one or more intermediate substrate layers.

16. The power transistor package of claim 13, wherein the output matching network comprises at least one component disposed on the top substrate layer or on one of the one or more intermediate substrate layers.

17. A power transistor package, comprising:

a bottom substrate layer comprising a conductive flange portion integrated with a dielectric portion;

a transistor attached to the conductive flange portion of the bottom substrate layer, the transistor having an input terminal and an output terminal;

one or more intermediate substrate layers bonded to the bottom substrate layer, the one or more intermediate substrate layers each having a cut away center region overlying the transistor location on the bottom substrate layer;

a top substrate layer bonded to the bottom substrate layer, thereby enclosing the transistor within the package;

an input contact and an output contact, the input and output contacts comprising respective conductors disposed on the bottom substrate layer and electrically coupled to the respective transistor input and output terminals.

18. The power transistor package of claim 17, wherein the bottom substrate layer is formed by pressure fitting the conductive flange portion into the dielectric portion.

* * * * *